United States Patent
Kawai et al.

(10) Patent No.: US 6,758,999 B2
(45) Date of Patent: Jul. 6, 2004

(54) FORMING METHOD OF MAGNETIC BODY AND PRINTED CIRCUIT BOARD

(75) Inventors: Hideharu Kawai, Nagoya (JP); Toru Matsuzaki, Nagoya (JP)

(73) Assignee: Kitagawa Industries Co., Ltd., Nagoya (JP)

(*) Notice: Subject to any disclaimer, the term of this patent is extended or adjusted under 35 U.S.C. 154(b) by 0 days.

(21) Appl. No.: 10/209,394

(22) Filed: Jul. 30, 2002

(65) Prior Publication Data

US 2003/0026962 A1 Feb. 6, 2003

(30) Foreign Application Priority Data

Aug. 1, 2001 (JP) ......................... 2001-233559

(51) Int. Cl.[7] .................. B29C 45/14; B29C 70/74; B29C 70/78
(52) U.S. Cl. ............... 264/267; 264/271.1; 264/272.15; 264/272.17; 264/273; 264/274; 264/275
(58) Field of Search ................. 264/611, 104, 264/105, 255, 259, 267, 271.1, 272.11, 272.12, 272.13, 272.15, 272.17, 273, 274, 275; 29/602.1, 605, 606

(56) References Cited

U.S. PATENT DOCUMENTS

| | | | |
|---|---|---|---|
| 3,025,480 A | | 3/1962 | Guanella |
| 3,650,023 A | | 3/1972 | Kubik .................... 29/602 |
| 4,898,759 A | * | 2/1990 | Hoover et al. .............. 428/99 |
| 4,935,174 A | * | 6/1990 | Suzuki ...................... 264/440 |
| 5,047,283 A | * | 9/1991 | Leatherman et al. ......... 428/209 |
| 5,599,413 A | * | 2/1997 | Nakao et al. .............. 156/89.12 |
| 5,714,102 A | * | 2/1998 | Highum et al. ............. 264/105 |
| 6,149,857 A | * | 11/2000 | McArdle et al. ............ 264/429 |
| 6,168,442 B1 | * | 1/2001 | Naoi ........................ 439/91 |
| 6,200,508 B1 | * | 3/2001 | Jacobson et al. ........... 264/104 |
| 6,261,508 B1 | * | 7/2001 | Featherby et al. .......... 264/408 |

FOREIGN PATENT DOCUMENTS

| | | |
|---|---|---|
| EP | 0 984 465 A2 | 3/2000 |
| EP | 0 984 465 A3 | 3/2000 |
| JP | 04094586 | 3/1992 |
| JP | 04101405 | 4/1992 |
| JP | 06097610 | 4/1994 |

* cited by examiner

Primary Examiner—Angela Ortiz
(74) Attorney, Agent, or Firm—Davis & Bujold, PLLC

(57) ABSTRACT

A method of forming a magnetic body, alternative to a ferrite core, on a printed circuit board is provided. A printed circuit board is set in a mold and injection molding is conducted. The mold comprises a fixed plate, an intermediate plate and a movable plate. A cavity in the intermediate plate is filled with a melted material (i.e., mixture of resin and magnetic filler) supplied via a sprue and a runner. A cavity in the movable plate is also filled with the material supplied to the cavity in the intermediate plate through a hole in the printed circuit board. When a magnetic body for noise control is directly injection molded onto the printed circuit board in such a way, no gap appears between the magnetic body and the printed circuit board. As a result, the magnetic body functions well as desired.

9 Claims, 5 Drawing Sheets

FORMING METHOD OF MAGNETIC BODY AND PRINTED CIRCUIT BOARD

FIELD OF THE INVENTION

This invention relates to a method of forming a magnetic body, such as a choke or transformer core, on a printed circuit board, the magnetic body, and the printed circuit board on which the magnetic body is formed.

BACKGROUND OF THE INVENTION

FIG. 4A shows a conventional method for providing a ferrite core and the like on a printed circuit board, for noise control or for use in transformer and choke coil. In this case, a ferrite core is formed and split into two pieces in advance. The split ferrite core pieces 51a, 51b are then attached to a printed circuit board 3, respectively, from both sides and glued to each other via attachment holes 5, 5 created beforehand.

However, since a ferrite core is typically molded from compacted ferrite material by a sintering molding process, it is difficult to form the core to the desired measurements and shape. Thus, it is necessary to grind the sinter molded ferrite core to the desired dimensions after the core is sintered. Also, if the maximum tolerances of the sintered ferrite core are too great, the distances to adjacent electronic components on a printed circuit board must be at least as great as the tolerances, and this could prevent high density packaging. Moreover, a ferrite core which is made too thin is likely to break or get chipped when dropped or in transit.

Additionally, if the ferrite core pieces 51a, 51b are attached as above, gaps 57 are likely to appear between the respective ferrite core pieces 51a, 51b and a circuit pattern 6 on the printed circuit board 3 as illustrated in FIG. 4B. A gap 57 between the circuit pattern 6 and the ferrite core pieces 51a, 51b causes a decline in magnetic properties of the ferrite core, which increases rapidly as the gap 57 increases.

SUMMARY OF THE INVENTION

An object of the present invention is to provide a magnetic body, and a manufacturing method thereof, as an alternative to a ferrite core or similar shape, for noise control and for use in transformers and choke coils.

In order to attain the above object, the present invention discloses a method of forming a magnetic body by preparing a magnetic material by mixing and melting at least a magnetic filler and a binder containing one or more kinds of resin, setting a printed circuit board in a mold, and injection molding to or around the printed circuit board using the magnetic material, by which the magnetic body is formed to cover a circuit pattern on the printed circuit board.

According to such a forming method, the magnetic body includes resin as binder, and is thereby more resistant to shocks than ferrite alone. Owing to injection molding of the body, the molding tolerances are reduced to 10% of that of the case of sintering molding. Accordingly, there is no need to grind the magnetic body after it is formed. Also, it is possible to arrange the magnetic body close to other electronic components which are generally provided on a printed circuit board (including a flexible board). Thus, high density packaging is realized.

In another aspect of the present invention, the magnetic body is formed in such a manner that it is appressed to the printed circuit board as a result of the injection molding process. Wherein the term "appressed" means that a magnetic body 7 is formed as a single, unitary body without unwanted gaps therein or unwanted gaps between the magnetic body and the printed circuit board.

In this way, a decline in magnetic properties which results from gaps between the printed circuit board and the magnetic body is prevented. With injection molding, it is easy to have the magnetic body appressed to the printed circuit board.

In further aspect of the present invention, a gate for supplying the melted material to a cavity of the mold is in the form of pin gate.

In this case, a cross section of the gate becomes small and a trace of the gate on the molded magnetic body is not obtrusive, or clearly distinct. Therefore, the gate can be provided at any desired position, even when two magnetic bodies (or a magnetic body and another member) are molded adjacently.

In another aspect of the present invention, the printed circuit board has at least one through-hole in an area where the magnetic body is formed, and material is supplied to form the magnetic body on both sides of the printed circuit board via the through-hole.

In this way, the magnetic body is formed on both sides of the printed circuit board at one time, and it is not necessary to use adhesives and the like to hold the magnetic body fast to the printed circuit board.

In another aspect of the present invention, the magnetic body is formed to cover an electronic component mounted on the printed circuit board.

The covered electronic component is protected from noise. The electronic component to be covered may be a pin, resistance or condenser. Other electronic components can be covered as well.

As explained above, such a magnetic body can function to the full extent, and it does not need be ground after formed.

Additionally, the magnetic body may be formed on only one side of the printed circuit board.

On such a printed circuit as well, the magnetic body can be set adjacent to other electronic components, and high density packaging can be attained.

BRIEF DESCRIPTION OF THE DRAWING FIGURES

The invention will now be described, by way of example, with reference to the accompanying drawing, in which.

DETAILED DESCRIPTION OF THE INVENTION

Figure 1A:
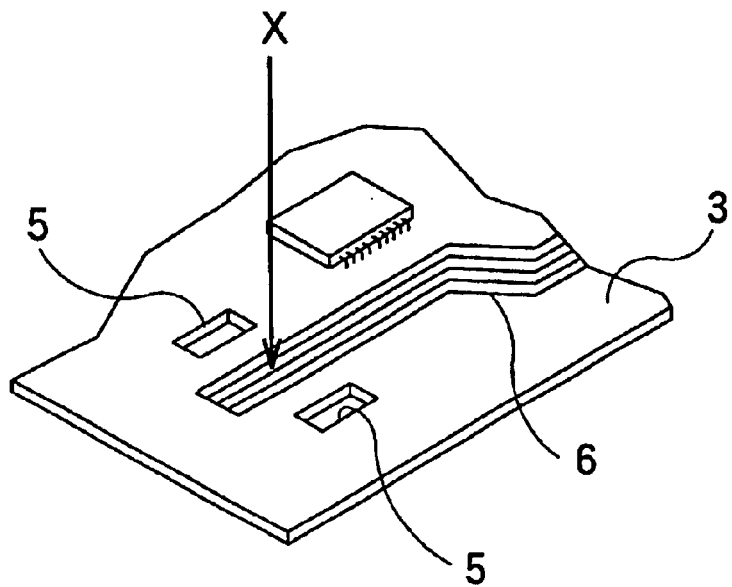
FIGS. 1A–1C are explanatory views which illustrate the forming of a magnetic body 7 for noise control or for use as a transformer or choke coil on a printed circuit board 3 according to the present invention.
Figure 1B:
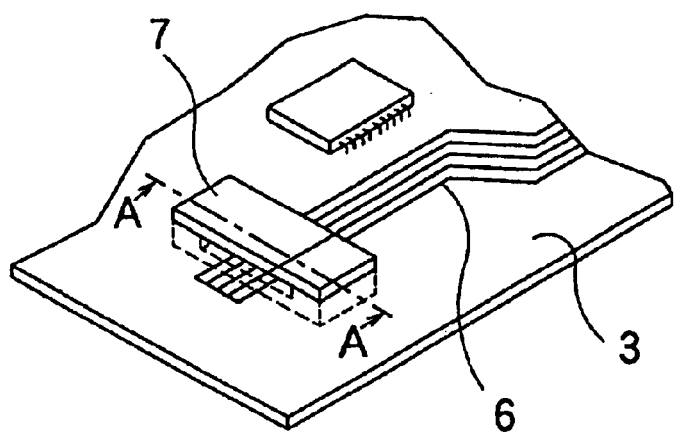
Figure 1C:
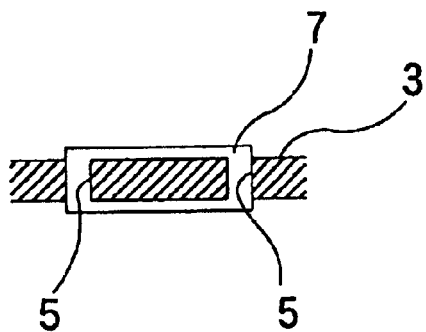
Figure 2A:
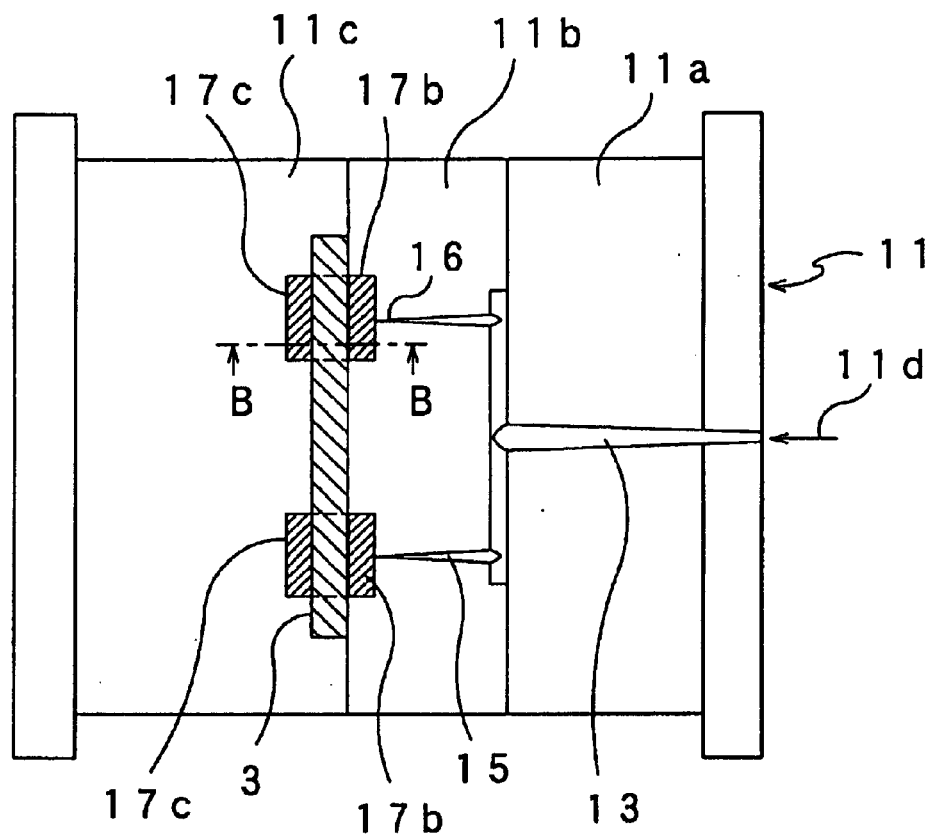
FIGS. 2A and 2B are explanatory views which illustrate forming of the magnetic body 7 in a mold.
Figure 4A:
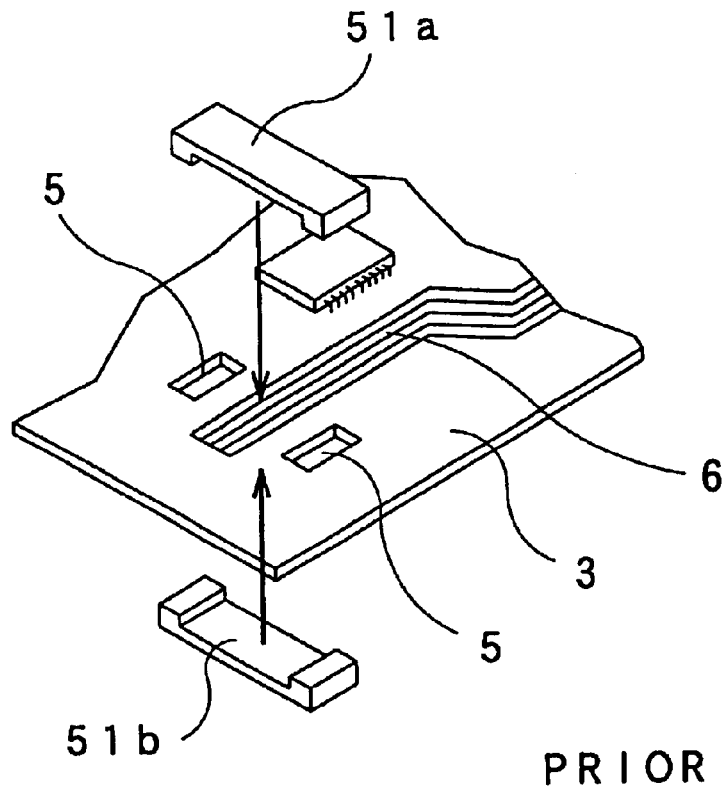
FIGS. 4A and 4B are explanatory views of prior art using ferrite core pieces 51a, 51b for noise control.
Figure 4B:
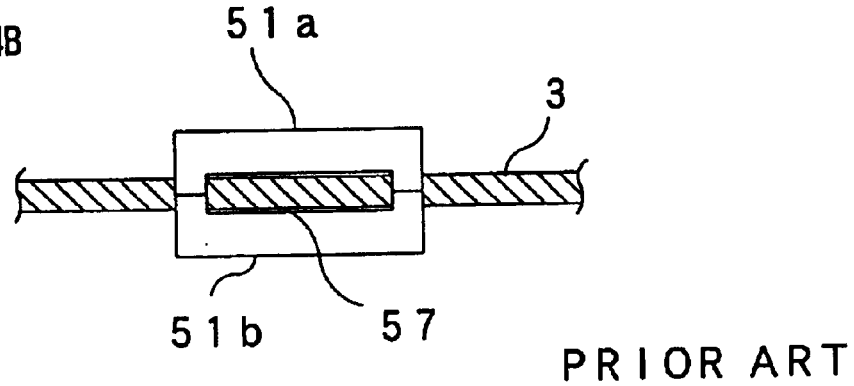

FIGS. 1A–1C, 2A and 2B show how a printed circuit board 3 according to the present invention is produced. With regard to components in those figures, the same reference numbers as those in FIGS. 4A and 4B are used to represent the same components, so far as such use of the same numbers does not cause unnecessary confusion. As an example, a case is described in which a magnetic body for noise control is provided in a position X on the printed circuit board 3 of FIG. 1A. As in the prior art, attachment holes 5, 5 are created in the printed circuit board 3 in advance. The printed circuit board 3 is then set in a mold 11 as shown in FIG. 2A to perform the injection molding process. This mold 11 comprises a fixed plate 11a, an intermediate plate 11b and a movable plate 11c. A melted material 11d comprised of a magnetic material filler and a binder is filled into a cavity 17b via a sprue 13, a runner 15 and a gate 16.

Figure 2B:
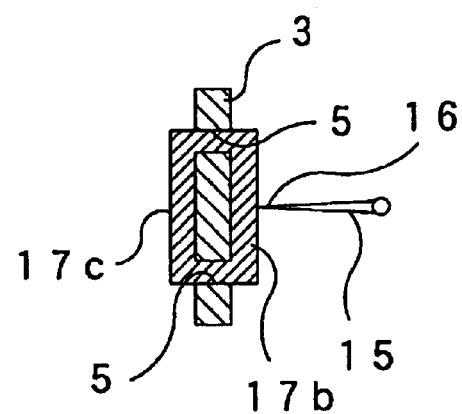

FIG. 2B is a sectional view taken along the line B—B in FIG. 2A. The cavity 17b on the intermediate plate 11b communicates to a cavity 17c on the movable plate 11c via one or more holes 5 in the printed circuit board 3. The material 11d supplied to the cavity 17b reaches and fills the cavity 17c through one or more holes 5, 5. With regard to components of the material 11d to be filled, soft ferrite is used as a magnetic filler, and PA12 is used as binder. In this example, the gate 16, which is an inflow opening which supplies the material to the cavity 17b, is in the form of pin gate. However, the gate 16 may be in the form of side gate or submarine gate.

FIG. 1B shows a portion of the printed circuit board 3 after direct injection molding by which, for example, a magnetic body 7 for noise control is formed on the printed circuit board 3. The magnetic body 7 appears similar to conventional ferrite cores pieces 51a, 51b. However, as can be seen in FIG. 1C which is a sectional view taken along the line A—A in FIG. 1B, no gap 57 appears in the magnetic body 7 or between the magnetic body 7 and the printed circuit board 3. Consequently, the magnetic body 7 for noise control can function well and without degradation of its magnetic properties.

Figure 5A:
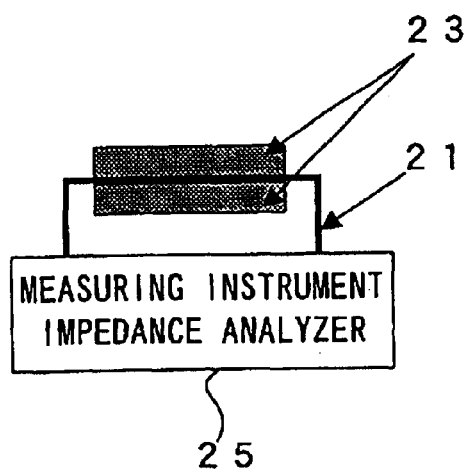
FIGS. 5A–5C are explanatory views of an experiment which measures effect by making a magnetic body fast to a printed circuit board.
Figure 5B:
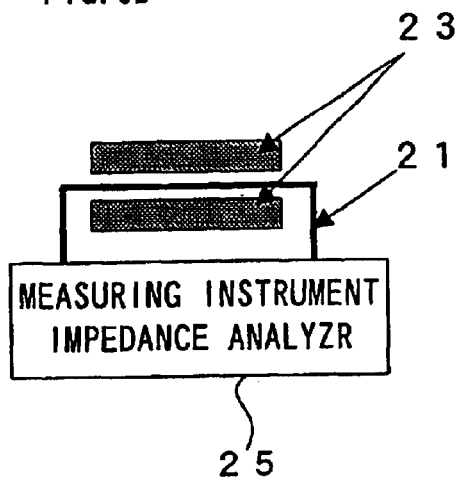
Figure 5C:
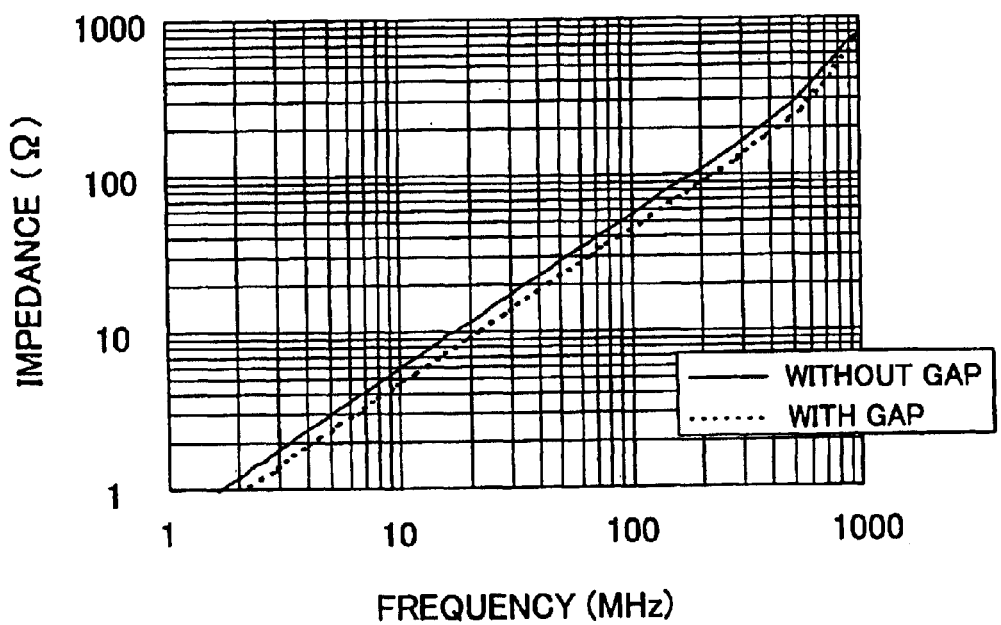

An experiment was conducted on respective cases in which the magnetic body 7 is appressed to the printed circuit board 3 by the method of the present invention and in which the magnetic body 7 is not appressed to the printed circuit board 3. FIG. 5A shows the case in which the magnetic body 7 is appressed to the printed circuit board in accordance with the present invention. As shown, a magnetic body mixed resin and ferrite is appressed to and around a measuring cable 21. FIG. 5B shows the case in which the magnetic body is not appressed to the printed circuit board according to the present invention and gaps 57 of 0.5 mm are formed between the measuring cable 21 and respective pieces of the magnetic body 23. FIG. 5C is a graph showing the result of measurement by impedance analyzer 25 of impedance frequency characteristics in both cases. A lateral axis represents frequency and a longitudinal axis represents impedance. A full line shows the case of having no gap (FIG. 5A), and a dotted line shows the case of having gaps (FIG. 5B). As can be seen from this graph, when the magnetic body mixed resin 23 is appressed to the measuring cable 21 by the method of the present invention, superior impedance frequency characteristics were achieved.

In other words, from this graph, it is understood that higher impedance is achieved at any frequency in the case of having no gap compared to the case of having gaps. The higher the impedance is, the higher and superior the noise absorption is.

A magnetic body 7 of the present invention is also break resistant since PA12 is used as binder. Accordingly, the magnetic body 7 does not easily break or get chipped, unlike the ferrite core pieces 51a, 51b, which break easily. In addition, since the magnetic body 7 is formed as a single, unitary body extending to both sides of the printed circuit board 3, gluing is not necessary, as in the case of ferrite core pieces 51a, 51b. Also, since the forming tolerance is reduced to 10% of that of the case in using a sintered product, post-forming processing like grinding becomes unnecessary, and thus it is possible to simplify the manufacturing process. By the same reason, the distances to adjacent electronic components can be made smaller, and thus high density packaging can be realized.

In the above, an embodiment of the present invention is described. However, the present invention is not limited to the above embodiment, and other modifications and variations are possible within the scope of the present invention.

For instance, in the present embodiment, soft ferrite is used for magnetic material. However, other materials such as hard ferrite, amorphous in Fe, Fe—Si, Fe—Si—Al, Fe—Si—Cr, Fe—Ni, Fe—Cr, and Co system, Fe-based nanocrystal can be used. In addition, the magnetic filler made from such magnetic materials can be formed in any shape, such as round, flat, etc.

Also, the binder can be thermoplastic resin such as EVA (Ethylen-Vinylacetate copolymer), EVOH (Ethylene-Vinylalcohol-Copolymer), PVC (PlyVinylChloride), CPE (Chlorinated polyethylene), CA (Cellulose-Acetate), POM (PolyOxyMethylene), PA (PolyAmide), PAR (Polyarylate), TPU (Thermoplastic Polyurethane), TPE (Thermoplastic-Elastomer), LCP (Liquid Crystal Polymer), PEEK (PolyEtherEtherKetone), PSU (Polysulphone), PES (PolyEtherSulfone), HDPE (High Density Polyethylene), LDPE (Low Density Polyethylene), LLDPE (Linear Low Density Polyethylene), PET (PolyEthylene Terephthalate), PC (PolyCarbonate), PS (Polystyrene), PPE (PolyPhenyleneEther), PPO (PolyPhenyleneOxide), PPS (PolyPhenyleneSulfide), PBD (PolyButadiene), PBT (PolyButhylene Terephthalate), PP (PolyPropylene), PMMA (PolyMethylMethAcrylate), PMP (Polymethylpentene) and BP (Butyl Phthalate), thermosetting resin such as EP (Epoxy resin), PDAP (Polydiallyl Phthalate), SI (Silicone), PF (Phenol-Formaldehyde), UP (Unsaturated Polyester), Pi (Polyimide), PUR (Polyurethane), MF (Melamine-Formaldehyde) and UF (Urea-Formaldehyde), vulcanized rubber such as SBR (Styrene-Butadiene Rubber), NBR (Nitril-Butadiene Rubber), IR (Isoprene Rubber), CR (Chloroprene-Rubber), BR (Butadiene Rubber), IIR (Isobutylene-Isoprene Rubber), EPDM (Ethylene-Propylene-Diene Methylene linkage), CSM (ChloroSulfonated Polyethylene), AR (Acrylic rubber), FR (Fluorine Rubber), VMQ (Silicone Rubber), ECO (Epichlorhydrin Rubber) and EU (PolyeterUrethane rubber), polyurethane or silicone thermoplastic rubber, liquid rubber or elastomer.

Figure 3A:
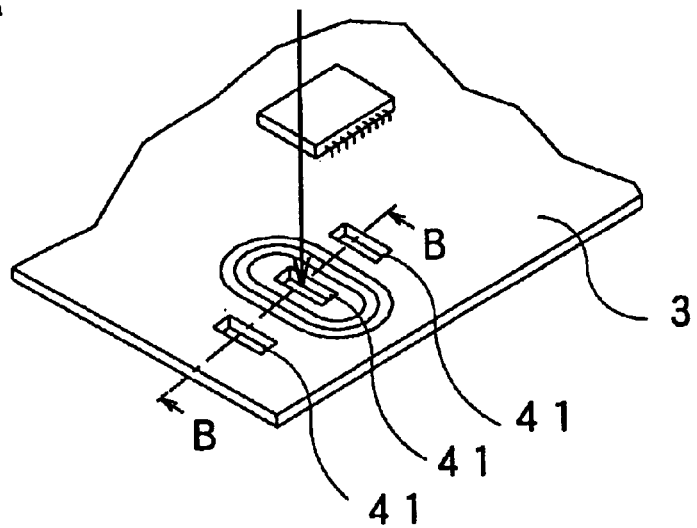
FIGS. 3A–3D are explanatory views of a magnetic body 43 for use in transformer, formed according to the present invention.
Figure 3B:
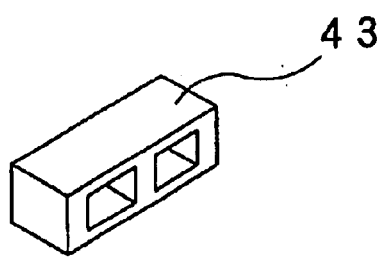
Figure 3C:
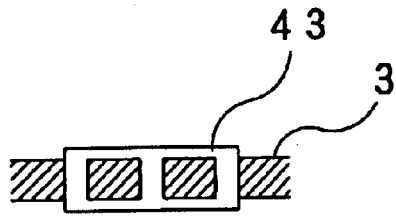
Figure 3D:
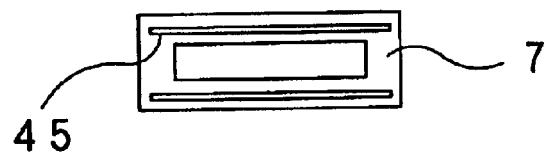

In addition, and for example, a magnetic transformer body 43, as shown in FIG. 3B, may be formed on the printed circuit board 3 on which three attachment holes 41 are created as shown in FIG. 3A. In this case as well, the magnetic transformer body 43 having an 8-shaped cross section as shown in FIG. 3C can be formed appressed to the printed circuit board 3. Furthermore, when setting the printed circuit board 3 in the mold, it is possible to insert a sintered ferrite plate 45 or a magnetic metal plate 45 in the cavity before performing the injection molding. Then, it is possible to form a magnetic body 7 containing a sintered ferrite plate 45 as shown in FIG. 3D.

Moreover, a magnetic body 7 for choke coil may be formed on the printed circuit board 3. It is also possible to form a magnetic body 7 only on one side of the printed circuit board 3. Additionally, the circuit pattern 6 can be a signal line, power line, ground line, transformer circuit pattern or choke coil pattern.

What is claimed is:

1. A method of forming a magnetic body comprising steps of:

preparing a material by mixing and melting at least a magnetic filler and a binder including at least one resin;

placing a printed circuit board into a mold; and supplying the material to the printed circuit board within the mold so as to form a magnetic body which covers a circuit pattern on the printed circuit board;

wherein said printed circuit board has at least one through-hole at an area where said magnetic body is formed, and said melted material is supplied via the through-hole to form said magnetic body on both sides of said printed circuit board.

2. The method of forming magnetic body according to claim 1, wherein said magnetic body is formed such that said magnetic body is appressed to said printed circuit board.

3. The method of forming magnetic body according to claim 1, wherein a gate, which is an inflow opening for supplying said material to a cavity of said mold, is a pin gate.

4. The method of forming magnetic body according to claim 1, wherein said magnetic body is formed such that said magnetic body covers an electronic component mounted on said printed circuit board; and said electronic component is one of a pin, a resistance, or a condenser.

5. A method of forming a magnetic body comprising steps of:

preparing a material by mixing and melting at least a magnetic filler and a binder including at least one resin;

placing a printed circuit board into a mold; and supplying the material to the printed circuit board within the mold so as to form a magnetic body which covers a circuit pattern on the printed circuit board;

wherein said magnetic body is formed so that said magnetic body covers an electronic component mounted on said printed circuit board.

6. The method of forming a magnetic body according to claim 5, wherein said magnetic body is formed such that said magnetic body is appressed to said printed circuit board.

7. The method of forming a magnetic body according to claim 5, wherein a gate, which is an inflow opening for supplying said material to a cavity of said mold, is a pin gate.

8. The method of forming a magnetic body according to claim 5, wherein said electronic component is one of a pin, a resistance, or a condenser.

9. A method of forming a magnetic body comprising steps of:

preparing a material by mixing and melting at least a magnetic filler and a binder including at least one resin;

placing a printed circuit board into a mold; and supplying the material to the printed circuit board within the mold so as to form a magnetic body which covers a circuit pattern on the printed circuit board;

wherein a gate, which is an inflow opening for supplying said material to a cavity on said mold, is a pin gate.

* * * * *